United States Patent
Abert et al.

(10) Patent No.: US 8,156,826 B2
(45) Date of Patent: Apr. 17, 2012

(54) ANTI-PINCH SENSOR

(75) Inventors: Carsten Abert, Hassfurt (DE); Thomas Weingaertner, Untereuerheim (DE); Wolf-Christian Mueller, Coburg (DE); Holger Wuerstlein, Zeil am Main (DE)

(73) Assignee: Brose Fahrzeugteile GmbH & Co. Kommanditgesellschaft, Coburg (DE)

( * ) Notice: Subject to any disclaimer, the term of this patent is extended or adjusted under 35 U.S.C. 154(b) by 261 days.

(21) Appl. No.: 12/304,508

(22) PCT Filed: Apr. 20, 2007

(86) PCT No.: PCT/EP2007/003467
§ 371 (c)(1),
(2), (4) Date: Oct. 19, 2009

(87) PCT Pub. No.: WO2007/144039
PCT Pub. Date: Dec. 21, 2007

(65) Prior Publication Data
US 2010/0050787 A1    Mar. 4, 2010

(30) Foreign Application Priority Data

Jun. 12, 2006 (DE) .................. 20 2006 009 188 U

(51) Int. Cl.
*G01L 1/12* (2006.01)
(52) U.S. Cl. .................. 73/862.626; 73/780
(58) Field of Classification Search .......... 73/760–780, 73/862.626
See application file for complete search history.

(56) References Cited

U.S. PATENT DOCUMENTS

| | | | |
|---|---|---|---|
| 6,747,399 B1 | 6/2004 | Ogino et al. | |
| 6,865,960 B2* | 3/2005 | Doemens et al. | 73/862.626 |
| 7,319,301 B2* | 1/2008 | Pribisic | 318/468 |
| 7,821,275 B2* | 10/2010 | Wuerstlein et al. | 324/663 |
| 7,908,927 B2* | 3/2011 | Washeleski et al. | 73/780 |
| 2003/0085679 A1 | 5/2003 | Bledin et al. | |
| 2005/0016290 A1 | 1/2005 | Shank et al. | |
| 2006/0117862 A1 | 6/2006 | Shank et al. | |
| 2008/0296927 A1* | 12/2008 | Gisler et al. | 296/146.4 |
| 2009/0146827 A1* | 6/2009 | Wuerstlein et al. | 340/657 |
| 2010/0256440 A1* | 10/2010 | Maher et al. | 600/16 |

FOREIGN PATENT DOCUMENTS

| | | |
|---|---|---|
| DE | 40 06 119 A1 | 8/1991 |
| EP | 1 154 110 A2 | 11/2001 |
| EP | 1 277 907 A | 1/2003 |
| EP | 1 455 044 A2 | 9/2004 |
| WO | WO 89/08352 A | 9/1989 |
| WO | WO 97/01835 A | 1/1997 |

* cited by examiner

*Primary Examiner* — Max Noori
(74) *Attorney, Agent, or Firm* — Muncy, Geissler, Olds & Lowe, PLLC

(57) ABSTRACT

An anti-pinch sensor (10,13,40,45) with an associated evaluation circuit (33,48) is disclosed, which is suitable in particular for recognizing an obstacle in the way of an actuating element (e.g., 9) of a motor vehicle (1). The anti-pinch sensor (10,13,40,45) comprises a sensor body, which contains a sensing electrode (17), for generating an external electric field with respect to a counter-electrode (25), and a pressure sensor (34,34') decoupled from the sensing electrode (17), for detecting a mechanical pressure.

22 Claims, 4 Drawing Sheets

Figure 2B:
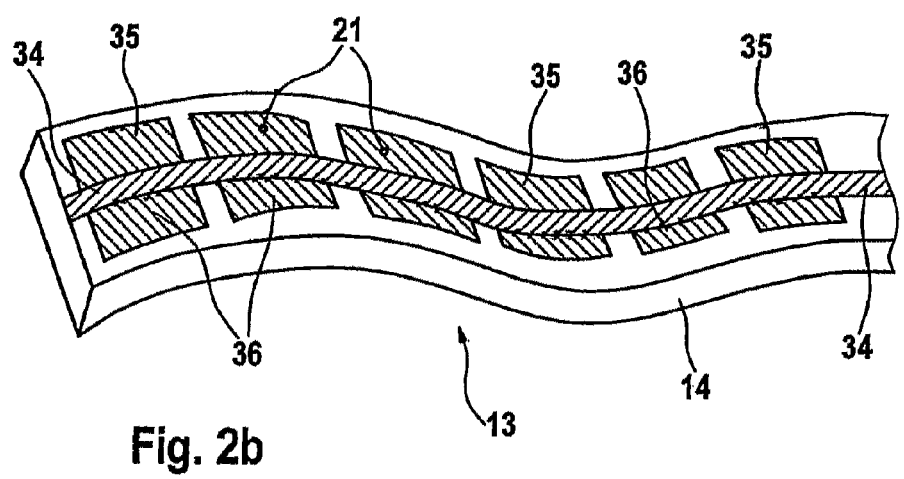

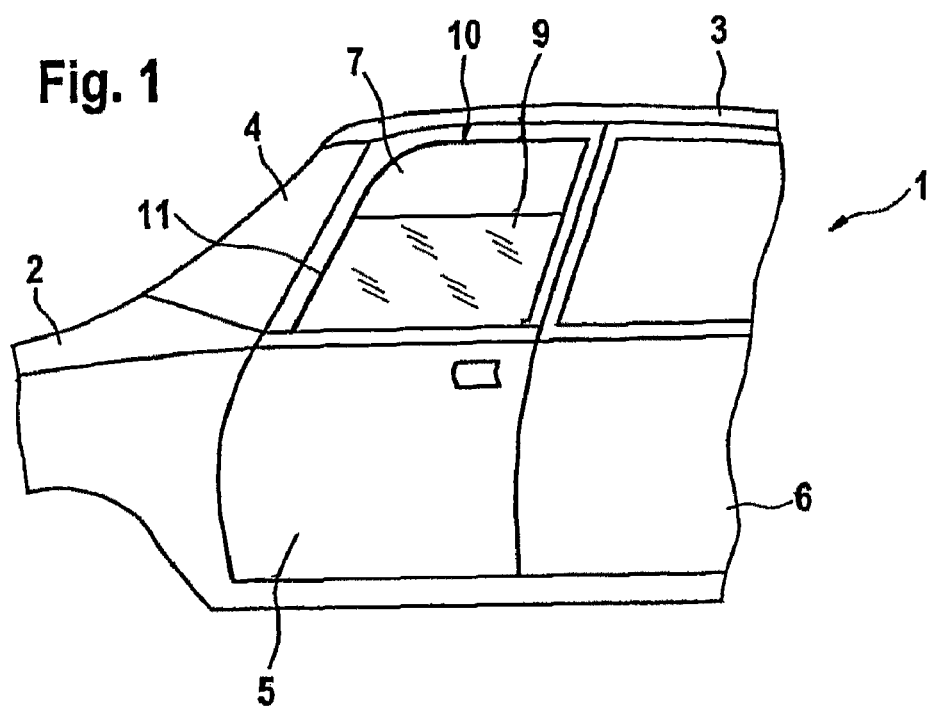
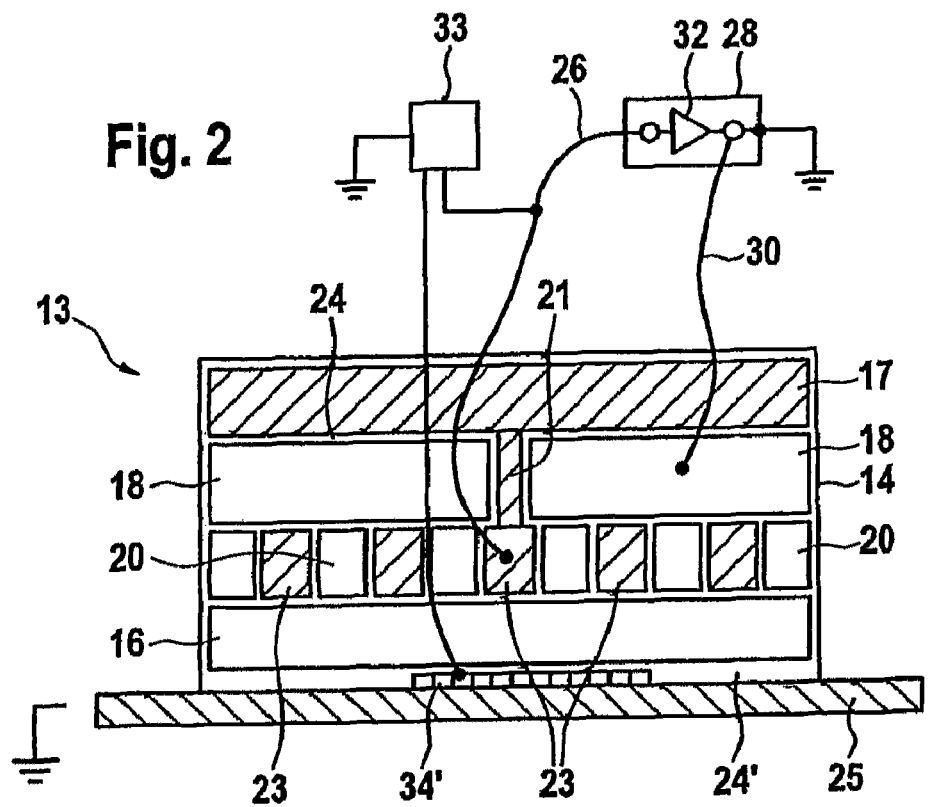

ANTI-PINCH SENSOR

This application is a national stage of International Application No.: PCT/EP2007/003467, which was filed on Apr. 20, 2007, and which claims priority to German Patent Application No.: 20 2006 009 188.2, which was filed in Germany on Jun. 12, 2006, and which are both herein incorporated by reference.

The invention relates to an anti-pinch sensor, particularly for detecting an obstacle in the path of an actuating element of a motor vehicle.

Prior-art anti-pinch sensors utilize, for example, the capacitive measuring principle to detect an obstacle. In this case, an electric field is created between a sensing electrode and a suitable counter electrode. If a dielectric enters this electric field, the capacitance of the capacitor formed by the sensing electrode and the counter electrode changes. In this way, theoretically any obstacle in the path of an actuating element of a motor vehicle can be detected, whose relative permittivity $\in_r$ differs from the relative dielectric constant of air. The obstacle in the path of an actuating element is detected without any physical contact with the anti-pinch sensor. If a change in capacitance is detected, countermeasures, such as, for example, stopping or reversing of the drive, can be initiated in a timely fashion, before an actual pinching of the obstacle occurs.

In the case of actuating elements of a motor vehicle, this may refer, for example, to an electrically actuated window, an electrically actuated sliding door, or an electrically actuated trunk lid. An anti-pinch sensor, based on the capacitive measuring principle, may also be used for detecting an obstacle in the case of an electrically actuated seat.

Non-contact anti-pinch sensors, based on the capacitive measuring principle, are known, for example, from European Pat. Appl. Nos. EP 1 455 044 A2 and EP 1 154 110 A2. Both sensors generate an external electric field by means of a sensing electrode and a suitable counter electrode, so that a dielectric entering this external electric field may be detected as a change in capacitance between the sensing electrode and counter electrode. To be able to assure a high reliability in the detection of pinching, in addition in the two prior-art anti-pinch sensors the distance between the sensing electrode and counter electrode is designed as flexible, as a result of which physical contact between an obstacle and the anti-pinch sensor can also be detected as a change in capacitance.

According to European Pat. Appl. No. EP 1 455 044 A2, to this end, the sensing electrode and the counter electrode are separated from one another by a material-free hollow chamber in a sensor body made of an elastic insulation material. European Pat. Appl. No. EP 1 154 110 A2 proposes providing a material area with a rigidity reduced compared with the other insulating material in a sensor body made of an insulating material between a sensing electrode and counter electrode. This material area as well can be formed as a material-free hollow chamber.

Disadvantageously, both anti-pinch sensors according to the prior art exhibit a high sensitivity to external electromagnetic interference fields. This makes it more difficult to evaluate the sensor signals during the coming together of the sensor and counter electrode. Furthermore, in both anti-pinch sensors, adhering between the sensing and counter electrode can occur in a disadvantageous manner, which means at least a partial failure of the anti-pinch sensor.

The object of the invention is to provide an anti-pinch sensor, which offers as high a reliability as possible during detection of pinching in the path of an actuating element of a motor vehicle. It is the object of the invention further to provide an evaluation circuit suitable for an anti-pinch sensor of this type.

This object is achieved according to the invention by the combination of the features in claim 1.

The invention in this case in a first step proceeds from the consideration that an obstacle in the path of an actuating element is detected with the aforementioned anti-pinch sensor according to prior art indeed both without contact in the case of proximity and with physical contact, but that the prior-art anti-pinch sensors in the actual sense do not work redundantly, because the same components are used for both non-contact and tactile detection. The capacitance between a sensing electrode and a counter electrode is evaluated both with respect to its dependence on a penetrating dielectric and with respect to its dependence on the electrode distance. This has the result, however, that failure of a part of the system is equivalent to failure of the entire system. If, for example, the sensing electrode and the counter electrode stick to one another or liquid penetrates between the sensing electrode and the counter electrode, the capacitance formed between the electrodes can no longer be used for non-contact detection of a penetrating dielectric.

The invention resolves this problem by providing for the detection of physical contact a pressure sensor that is decoupled from the sensing electrode to generate an external electric field. Therefore, even with total failure of the sensing electrode, necessary for the non-contact detection of an obstacle, the physical contact of an obstacle with the anti-pinch sensor continues to be detected and countermeasures are immediately instituted. This greatly increases the reliability for detecting pinching compared with prior-art anti-pinch sensors.

Apart from increasing the reliability in the detection of pinching, the invention offers the further advantage that the pressure sensor and the sensing electrode can be evaluated completely independently of one another and therefore in particular parallel. The coupled subsystems of prior-art anti-pinch sensors, in contrast, can only be evaluated serially, because the same components are used for both subsystems, and this is always associated with an undesirable time delay.

In designing the anti-pinch sensor, it is not necessary that the sensor body be made of an elastic material. The separate pressure sensor, decoupled from the sensing electrode provided to form a measurement capacitance, can be arranged in particular at an exposed place, which enables detection of an external force or pressure. Thus, the pressure sensor, for example, can be arranged on or under the surface of the anti-pinch sensor.

For use of the anti-pinch sensor in the automotive sector, it is practical, however, for the sensor body to be made of a flexible, particularly elastic material. This makes it possible to run the anti-pinch sensor, for example, along the closing edge of an actuating element and in so doing to shape it according to predefined geometries. Arranging the pressure sensor in the interior of the anti-pinch sensor also permits an elastic design of the sensor body.

Yet, in the case of an elastic sensor body as well, there is a simple and cost-effective possibility of placing the pressure sensor on the sensor body as a contact element. In this case, the pressure sensor is advantageously arranged on a supporting surface of the sensor body. As a result, additional shielding of the sensing electrode can be achieved, which has a beneficial effect on the interference sensitivity to external fields. In the case of an elastic material of the sensor body as well, physical contact of an obstacle with the anti-pinch sensor can be detected by suitable deformation of the pressure sensor.

Because the sensor body comprises a pressure sensor part, made of a flexible, particularly elastic material, and a sensing electrode part, made of a material with a greater hardness, deformation under pressure of the pressure sensor embedded in the pressure sensor part has no effect on the capacitance between the sensing and counter electrode, because their distance is not changed or changed only negligibly by this. EPDM, for example, is suitable as a material for the pressure sensor part. A thermosetting synthetic resin or a hard plastic, for example, may be used for the material for the sensing electrode part.

For the aforementioned running of the anti-pinch sensor along a closing edge of an actuating element, it is expedient for the sensor body to extend in a longitudinal direction, the sensing electrode being made as a flat conductor. Apart from the use advantages and installation advantages of a shape of this kind, such an elongated anti-pinch sensor can also be produced cost-effectively by means of extrusion.

It is useful in particular to design the sensor body as a sealing body with a sealing contour. This makes it possible to install the anti-pinch sensor as it were as the sealing along the closing edge of the car body, e.g., as door or window weather stripping, for sealing against the closing element.

In another advantageous embodiment of the invention, the sensing electrode is divided along the longitudinal direction into a number of individual electrodes, each of which can be contacted via a separate line. It is achieved thereby that the capacitance measurable between the sensing electrode and the counter electrode declines, because the entire area of the sensing electrode is divided into several uninterrupted individual areas of the separated electrodes. A low capacitance, forming overall between the sensing and counter electrode, however, has the result that a small change in capacitance relative to the total capacitance can be detected more easily. The ratio of the change in capacitance and total capacitance shifts in favor of the change in capacitance. An anti-pinch sensor designed in this way, moreover, allows the detection of a change in capacitance by means of a multiplex process. In this case, the individual electrodes can be controlled by means of separate lines either displaced in time (serially) or simultaneously (parallel). A serial control offers the advantage that only a single evaluation circuit is necessary for detecting a capacitance change. Nevertheless, the time constant must be considered here until all individual electrodes have been connected through one after another. A parallel control in fact does not have the disadvantageous time delay, but requires a plurality of evaluation electronics for evaluation, as a result of which the cost increases.

The division of the sensing electrode into a number of individual electrodes offers the advantage of a spatially resolved detection of pinching. It is feasible in this respect if the pressure sensor as well is segmented along the longitudinal direction into a number of separately readable individual sensors. An anti-pinch sensor with segmentation of this kind of both the sensing electrode and the pressure sensor, moreover, permits providing a different prioritization of capacitance signals and pressure sensor signals in the different segments. Thus, for example, in the shear clearance of a trunk lid in the immediate vicinity of the pivot point or of the rotatable trunk lid seating, the non-contact detection of an obstacle by means of a change in capacitance can be turned off in favor of the tactile detection. In the area of the seating, the trunk lid and the vehicle body are close together, so that no electric far field can form by means of a sensing electrode relative to the body as a counter electrode. Rather, a direct capacitance will form between the sensing electrode and the neighboring trunk lid or between the sensing electrode and the frame when the anti-pinch sensor is located on the trunk lid. In this regard, detection of pinching by means of physical contact can be preferred there over non-contact detection.

It is further advantageous for the formation of an electric far field between the sensing electrode and counter electrode if the sensor body comprises a shielding electrode formed as a driven shield or a switchable shielding electrode. The shielding electrode used as a driven shield in this case is brought to the same potential as the sensing electrode by suitable switching means. No direct capacitance is formed in this way between the sensing electrode and the counter electrode. Rather, a spatially extensive electric field forms between the sensing electrode and the counter electrode shielded by the shielding electrode, so that a penetrating dielectric can be detected without contact owing to a change in capacitance. It is particularly suitable to use the car body as the counter electrode and particularly the frame of the body in which the actuating element is routed. In this case, the driven-shield electrode is to be arranged preferably so that the electric field forming between the sensing and counter electrode extends into the potential hazard region. This can be realized, for example, in that the driven-shield electrode is substantially opposite to the sensing electrode or is arranged between said electrode and the counter electrode.

For the embodiment in which the sensing electrode is segmented into individual electrodes, it is feasible for the shielding electrode to be divided into electrically contactable individual electrodes, between which the separate lines are arranged in an insulated manner. This also prevents the formation of a direct capacitance between the lines and the counter electrode.

All known types of pressure sensors are suitable in principle for the pressure sensor itself. Thus, a pressure-dependent resistor can be used, as well as a pressure-dependent capacitor or a pressure-sensitive light guide. In particular, so-called strain gauges may also be used whose change in resistance during mechanical extension or compression can be detected by measurement. It is also possible to use a Hall sensor as a pressure sensor, whereby a magnetic field around the Hall sensor changes under a pressure load. In order to keep the sensitivity of the anti-pinch sensor to external interference fields as low as possible, however, it is suitable to use a piezoelectric pressure sensor as the pressure sensor. In this case, the piezoelectric effect is utilized by means of a suitable piezoelectret, whereby the suitable piezoelectret generates an electrical voltage under the effect of pressure. A piezoceramic, which may also be shaped in particular as a piezoceramic film, may be used as a piezoelectret. Piezoelectric polymers are also known. The generated voltage can be tapped by means of electrodes, between which the piezoelectret or the piezoceramic is arranged.

In an especially advantageous embodiment, used as a pressure sensor is a piezoelectret whose electrical voltage generated under pressure is tapped by means of electrodes, one of these electrodes also being used as a shielding electrode of the driven shield. As a result, a compact anti-pinch sensor structure can be achieved.

The anti-pinch sensor can be realized both as a flat and round cable. It is also suitable to integrate the anti-pinch sensor into a circumferential seal on the frame of the closing element. Preferably, the anti-pinch sensor is made as a flexible conductor structure, for example, as a flexible flat cable (FFC) or as a flexible conductor structure (FPC, flexible printed circuit). Advantageously, in this case, the individual electrodes are each formed as flat traces within the flexible insulating material of the conductor structure.

The object in regard to an evaluation circuit is attained according to the invention by the features in claim 12. Accordingly, a suitable evaluation circuit for the aforementioned anti-pinch sensor comprises measurement potential output means to output a measurement potential to a sensing electrode, capacitance detection means to detect a measurement capacitance formed by a counter electrode and a sensing electrode, capacitance evaluation means to evaluate a change in the detected measurement capacitance, sensor evaluation means for the independent detection and evaluation of signals from a pressure sensor, and output means to output a detection signal as a function of the change over time in the measurement capacitance and to output a detection signal as a function of the evaluated pressure sensor signal.

The measurement potential output means are designed to output a suitable measurement potential or to generate a corresponding voltage to the sensing electrode or between the sensing electrode and the counter electrode. The measurement capacitance formed by the counter electrode and sensing electrode can then be detected in a direct voltage, for example, via a charge or discharge time. It is also possible to derive the measurement capacitance from the resonance frequency of a resonant circuit.

In a less interference-susceptible variant, which is simple in terms of measurement, the measurement potential output means comprise an AC voltage source. This permits in particular provision of a bridge circuit for detecting the measurement capacitance, whereby the measurement capacitance can be determined via its AC resistance or via its phase effect. In this case, the measurement capacitance is detected from the voltage dropping across it at a predefined AC voltage, for which purpose, for example, a peak value signal, which can be compared with a reference voltage, is generated from the tapped voltage. It is possible alternatively to detect the phase mismatching resulting from the capacitance in the interplay with a series resistance compared with the applied AC voltage.

To avoid misdetection of pinching during a slow drifting of the capacitance formed from the sensing electrode and counter electrode, controllable capacitors in particular for compensation can be provided. Capacitor diodes, for example, can be used as controllable capacitors.

The sensor evaluation means of the evaluation circuit are formed for the independent detection and evaluation of pressure sensor signals. As a result, a redundant detection of an obstacle in the path of an actuating element is enabled, whereby the obstacle is detected, on the one hand, without contact from the change in capacitance between the sensing electrode and counter electrode and, on the other, it is detected in a further closing process of the actuating element owing to the application of force or pressure to the pressure sensor.

In an advantageous embodiment, the capacitance detection and evaluation means and/or the sensor evaluation means are formed for the selective evaluation of individual electrodes and/or individual sensors arranged in segments. This permits spatial resolution of a recognized case of pinching by means of multiplexing.

In this case, as already mentioned, the output means can be designed in such a way that to output the detection signal the signals of the individual electrodes and the individual sensors in the different segments of the anti-pinch sensor are prioritized differently. This is useful, for example, when the anti-pinch sensor is used in the shear clearance of a trunk lid.

To determine the measurement capacitance or the signals of the pressure sensor, it is of further advantage to provide selective filters suitable for this, such as, for example, a bandpass filter. The measuring sensitivity can be increased as a result.

The use of the aforementioned evaluation circuit, the aforementioned anti-pinch sensor, or a component that comprises both the anti-pinch sensor and the evaluation circuit is suitable particularly in a motor vehicle, whereby the grounded body of the motor vehicle serves as the counter electrode. Of course, it is also possible, however, to arrange a counter electrode, which forms a capacitance with the sensing electrode, in the sensor body of the anti-pinch sensor.

Figure 3:
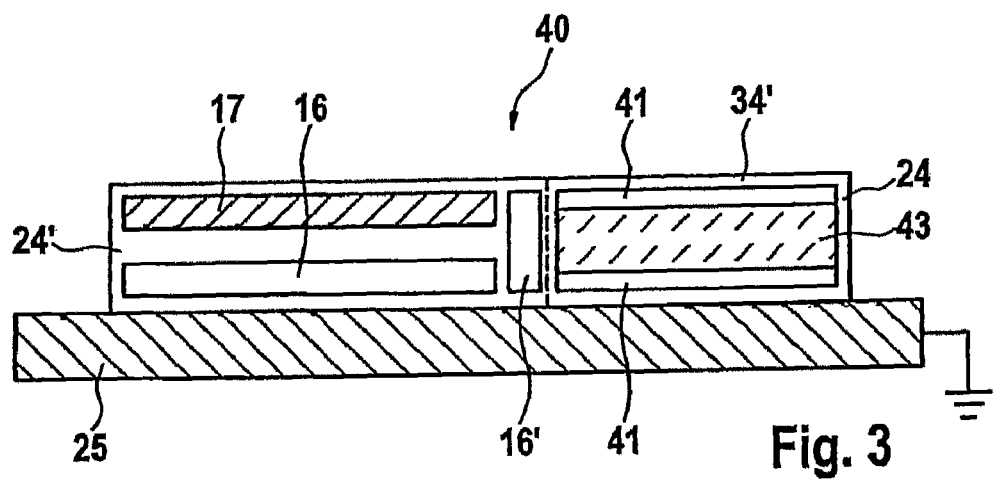
Figure 4:
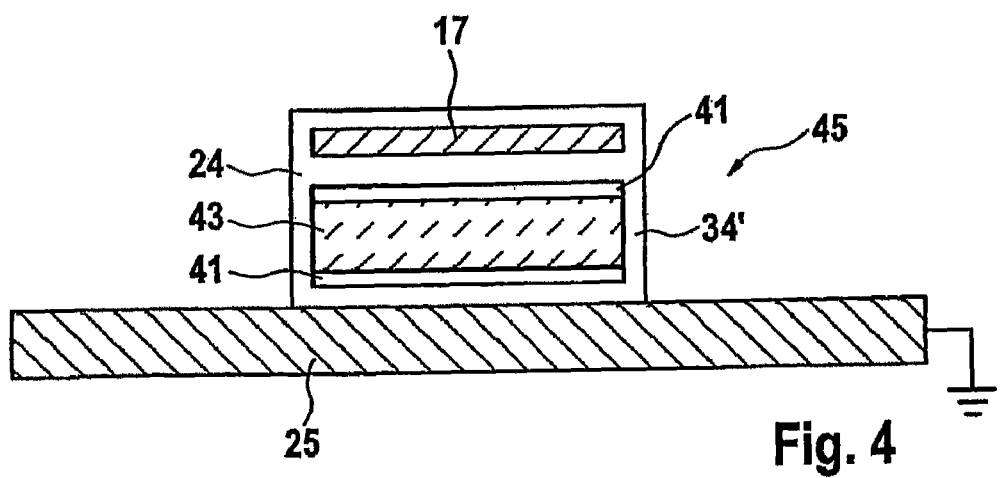
Figure 5:
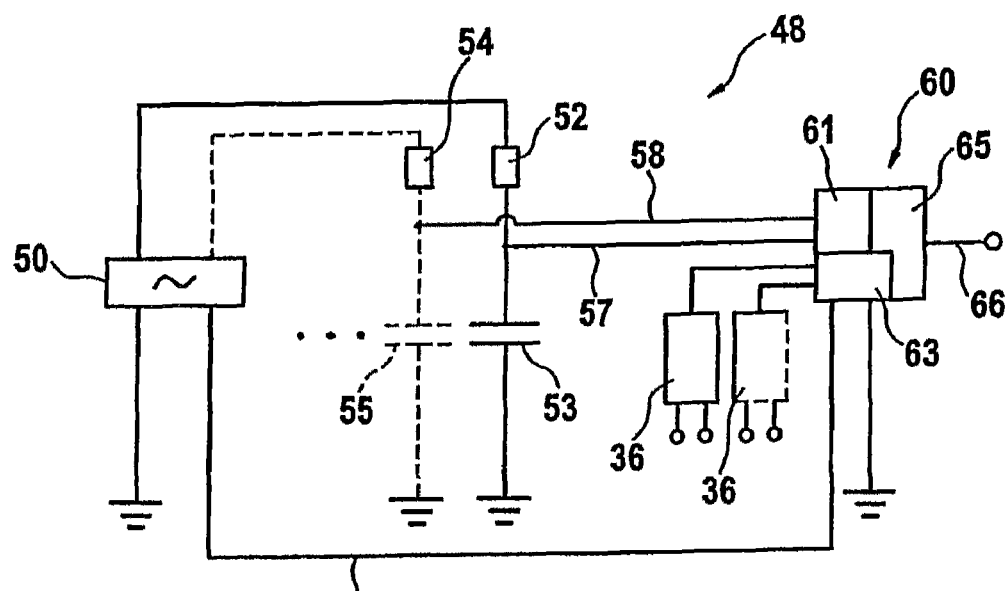

Exemplary Embodiments of The Invention Are Explained in Greater Detail With Use of A Drawing. Shown are in:

FIG. 1 schematically a side view of a motor vehicle;

FIG. 2 an anti-pinch sensor realized by a flexible printed circuit board in a cross section;

FIG. 2*b* in a plan view an alternative anti-pinch sensor;

FIG. 3 in a cross section another anti-pinch sensor realized as a flat cable;

FIG. 4 in a cross section an alternative anti-pinch sensor designed as a flat cable; and FIG. 5 schematically an evaluation circuit.

FIG. 1 shows schematically a side view of a motor vehicle 1, of which engine hood 2, roof 3, and windshield 4 are visible. Further, a front door 5 and a back door 6 are illustrated.

Front door 5 has as actuating element 7 an electrically driven pane 9. During closing of pane 9, it must be assured that there is no obstacle within the area of motion of pane 9. For this purpose, an anti-pinch sensor 10, which is realized by a sealing element 11, is mounted along the front and top inner contour of door 5. A plurality of individual electrodes (not shown here), which are separated from one another and have separate lines for control, are located in sealing element 11. Furthermore, a shielding electrode is arranged between the individual electrodes and the inner contour of front door 5 in seal 11. The body of motor vehicle 1 serves as the counter electrode.

Seal 11 comprises a sensor body made of an elastic plastic. Along seal 11, a series of pressure-sensitive individual sensors are mounted in the surface of the sensor body. It is possible by evaluating the signals from the individual sensors to localize an obstacle pressing physically from pane 9 against seal 11 and to institute appropriate countermeasures such as immediate stopping and subsequent reversal of the drive.

Before physical contact with seal 11 is made, an obstacle located within the area of motion of pane 9, which has a relative dielectric constant of >1, is already detected without contact by anti-pinch sensor 10, however. For this purpose, an electric field, which extends into the space because of the present shielding electrode, is generated between the sensing and the counter electrode by means of a measurement potential applied at the sensing electrode. If a dielectric obstacle penetrates into this external electric field, a change results therefrom in the capacitance formed from the electrodes, arranged in seal 11, and the body acting as the counter electrode. If this type of change in capacitance is detected, the electric drive is also halted by means of an appropriate control signal and driven in reverse, i.e., provided with current in the opposite direction.

To describe the operation, in FIG. 2 another anti-pinch sensor 13 is shown, which is formed by a flexible conductor structure 14 having several layers. The lower layer of flexible conductor structure 14 in this case is formed by shielding electrode 16 designed as a flat trace. Opposite to said layer, another flat trace is arranged as sensing electrode 17 in the top layer of printed circuit board 14. This is repeatedly divided in the longitudinal direction of printed circuit board 14 (not evident here). Below sensing electrode 17, an individual electrode 18 acting as shielding, which is connected in an electrically conducting manner to shielding electrode 16, is formed again as a flat trace. Additional individual electrodes 20, serving as shielding, and separate electric lines 23, which are used for contacting the individual electrodes arising by segmentation of sensing electrode 17, are now arranged alternately in each case in the layer between individual electrode 18 and shielding electrode 16. In the shown section, this is noticeable in that the centrally arranged electric line 23 is contacted electrically via a plated-through hole 21 with individual sensing electrode 17 arranged thereupon. For the plate-through hole, in this case individual electrode 18 has an aperture at the corresponding place. The electrodes are each insulated from one another by a flexible insulation material 24 of printed circuit board 14.

To detect an obstacle in the path of an actuating element, anti-pinch sensor 13 is placed on a grounded counter electrode 25, which can be formed, for example, by the body of a motor vehicle. To measure a change in capacitance caused by an obstacle, sensing electrode 17 is supplied with AC voltage by means of signal line 26, corresponding line 23, and the plated-through hole 21. The AC voltage in this case is generated by signal generator 28 relative to the ground potential. Further, individual electrodes 18 and 20, used for shielding, and shielding electrode 16 are supplied with an AC voltage, which is derived from the AC voltage fed to sensing electrode 17, by means of connecting line 30. For this purpose, switching means 32, formed as an operational amplifier, is used between signal line 26 and connecting line 30. It is assured in this way that electrodes 16, 18, and 20, used for shielding, are at the same potential as sensing electrode 17 without a time delay. As a result of individual electrodes 16, 18, and 20, being at the same potential, no direct capacitance forms between sensing electrode 17 and counter electrode 25. It is formed directly by shielding electrode 16 and counter electrode 25. Instead, an electric field, which extends into the space and whose encompassed space is available for detecting obstacles, arises between the edges of sensing electrode 17 and the counter electrode or grounded body 25. In this case, the capacitance formed by the edges of sensing electrode 17 and counter electrode 25 due to the shielding effect by individual electrodes 18 and 20 and shielding electrode 16 is clearly reduced compared with a direct capacitance.

To measure the change in capacitance, an evaluation circuit 33 is arranged between signal line 26 and the ground potential. Said evaluation circuit 33 detects the ratio of the capacitance change $\Delta C$ to capacitance $C$. Because capacitance $C$ is low, a small change in capacitance $\Delta C$ can be detected. To detect the capacitance, either a measuring bridge can be used or the charge constant can be monitored. Prefabricated commercially available electronic components can be used for this purpose as well.

A pressure sensor 34' is arranged approximately centrally on the supporting surface of the sensor body of anti-pinch sensor 13. Pressure sensor 34' in this case is realized as a piezoelectric sensor, which upon application of pressure generates a measurable piezo voltage. If an obstacle in the path of travel is physically contacted by the actuating element relative to anti-pinch sensor 13, deformation of pressure sensor 34' results, which is detected by evaluation circuit 33, connected to pressure sensor 34', as a result of a changed output signal. Therefore, the non-contact detection of an obstacle and the detection of physical contact with the obstacle in the illustrated anti-pinch sensor 13 occur totally independently from one another. To enable deformation of pressure sensor 34', the pressure sensor is embedded in an insulation material 24', which has a lower hardness than insulation material 24. In particular, insulation material 24' is an EPDM, i.e., an ethylene-propylene-diene rubber.

In FIG. 2b, anti-pinch sensor 13, shown in cross section in FIG. 2, is depicted with an alternative arrangement of a pressure sensor 34 in a plan view. In this case, flexible printed circuit board 14 is seen, which can be run along a contour of a motor vehicle, particularly along the contour of a closing edge of the frame of an actuating element. To clarify the structure, the insulation material on the top side of anti-pinch sensor 13 has been removed or not drawn. For this reason, individual electrodes 35, interrupted in the longitudinal direction of flexible printed circuit board 14, are clearly visible. Each of said individual electrodes 35 has a plated-through hole 21, connected to a separate line. A multiplex process can be used in this way to evaluate anti-pinch sensor 13. With signal generator 28 and evaluation circuit 33, shown in FIG. 2, individual electrodes 35 are controlled individually one after another displaced in time and the capacitances formed hereby are detected in each case. Due to the reduced area of individual electrodes 35 compared with a continuous trace, the capacitance between electrodes 35 and counter electrode 25 is further reduced. This permits a further increase in the detection sensitivity.

Further, an optical pressure sensor 34, which runs in the longitudinal direction and in which the transfer characteristic of a rapidly traversing beam of light is formed as a function of pressure, is arranged on the surface of anti-pinch sensor 13. To this end, an optical waveguide is employed, for example, upon whose deformation the ratio of reflection and transmission changes for a rapidly traversing beam of light. Physical contact of an obstacle with pressure sensor 34 is detected as a change in the transfer characteristic of a passing beam of light from one end of anti-pinch sensor 13 to its other end.

In FIG. 3, in a cross section another anti-pinch sensor 40 is shown, which is formed as a flat cable. Anti-pinch sensor 40 shown in FIG. 3 comprises substantially two subsystems, which are used for the non-contact detection of an obstacle or the detection of physical contact with an obstacle. In this case, the first subsystem for the non-contact detection of an obstacle is formed by a sensing electrode 17 formed as a flat conductor and by shielding electrodes 16 and 16' likewise formed as a flat conductor. Sensing electrode 17 of anti-pinch sensor 40 according to FIG. 3 in this case is not segmented in contrast to FIG. 2.

As described heretofore, application of a measurement potential to sensing electrode 17 and application of an identical potential to shielding electrodes 16 and 16' has the result that an electric field extending into the space is formed between sensing electrode 17 and grounded body 25. Therefore, a dielectric obstacle penetrating the electric field can be detected as a change in capacitance of the capacitor between sensing electrode 17 and shielding electrodes 16 and 16'.

Insulation material 24' in the area of the first subsystem, i.e., in the area of electrodes 16 and 17, is made as an epoxy resin, so that application of pressure causes no change in the distance between sensing electrode 17 and counter electrode 25.

As a further subsystem, a piezoceramic pressure sensor 34' is integrated into insulation material 24 of the sensor body. Piezoceramic pressure sensor 34' in this case comprises a piezoceramic 43 arranged between outer electrodes 41. Insulation material 24 is made in the area of the piezoceramic pressure sensor 34' as silicone rubber or as EPDM. An external pressure effect on anti-pinch sensor 40 results in deformation of piezoceramic 43 via elastic insulation material 24. A piezoelectric voltage results which can be tapped via electrodes 41.

Another anti-pinch sensor 45 made as a flat cable is shown in FIG. 4. In the shown case, insulation material 24, in which a sensing electrode 17 is embedded, is made entirely elastic. Below sensing electrode 17 there is a piezoceramic pressure sensor 34', which comprises a piezoceramic 43 arranged between flat electrodes 41.

Electrodes 41 of piezoceramic pressure sensor 34' are used, as shown in FIG. 2, as shielding electrodes and provided with the same measurement potential as sensing electrode 17. As a result, piezoceramic pressure sensor 34' fulfills the function of a shielding electrode, so that a desired outer electric field forms between sensing electrode 17, supplied with the measurement potential, and counter electrode 25 or the vehicle body. Therefore, a compact structure of anti-pinch sensor 45 can be achieved.

In the longitudinal direction of anti-pinch sensor 45, both sensing electrode 17 and piezoceramic pressure sensor 34' are each segmented into equally long sections. To this end, sensing electrode 17 is divided into individual electrodes. Piezoceramic pressure sensor 34' for this purpose comprises a series of individual readable pressure-sensitive individual sensors. This type of arrangement allows a spatial resolution of a case of pinching and also permits the signals of a change in capacitance (non-contact detection) and a pressure sensor 36, triggered due to physical contact, to be considered or prioritized differently for the detection of a case of pinching in different segments of anti-pinch sensor 45.

In FIG. 5, an evaluation circuit 48 for controlling one of the aforementioned anti-pinch sensors is shown schematically. Evaluation circuit 48 in this case comprises a controllable AC voltage source 50, and measuring bridges, each of which comprises a series resistor 52, 54 and measuring capacitor 53 or 55 to be measured in each case. Measuring capacitors 53, 55 are detected via the assigned signal taps 57 and 58, respectively, by means of an evaluation unit 60 by means of measuring bridges. For this purpose, evaluation unit 60 has capacitance evaluation means 61, which determines by means of a reference voltage the voltage dropping at the respective measuring capacitor 53 or 55 and determines herefrom the value of measuring capacitors 53 or 55. For this purpose, AC voltage source 50 is controlled in each case to output a corresponding AC voltage to the sensing electrode corresponding to the measuring capacitors 53, 55 to be determined.

Further, evaluation unit 60 comprises sensor evaluation means 63, which evaluates, on the one hand, a time change in the measuring capacitors 53, 55 and, on the other, sensor signals of assigned pressure sensitive individual sensors 36. Both with an appropriate temporal change of measuring capacitors 53, 55 and with a corresponding sensor signal of pressure sensors 36, sensor evaluation means 63 communicate with output means 65 in such a way that a corresponding detection signal is generated at detection output 66. Depending on the detection signal, by means of a suitable motor control the drive of an actuating element is stopped and driven in reverse.

Sensor evaluation means 63 can also be set up in such a way that, for example, for an anti-pinch sensor according to FIG. 4 the output of a detection signal in different segments of the anti-pinch sensor depends differently on the detection of a temporal change in the respective measuring capacitors 53, 55 and the pressure signals output in each case by the individual sensors. Thus, for example, in a predefined segment in the interplay between sensor evaluation means 63 and output means 65, a detection signal at detection output 66 is generated only when there is a suitable signal from the respective pressure sensor 36. In other segments, in turn, the change in capacitance of the respective measuring capacitors 53, 55 can lead to the generation of a detection signal at detection output 66, whereas pressure sensors 36 are disregarded.

List of Reference Characters

1 motor vehicle
2 engine hood
3 roof
4 windshield
5 door, front
6 door, back
7 actuating element
9 pane
10 anti-pinch sensor
11 sealing element
13 anti-pinch sensor
14 printed circuit board
16, 16' shielding electrode
17 sensing electrode
18 individual electrode (shielding)
20 individual electrode (shielding)
21 plated-through hole
23 lines
24 insulation material
25 counter electrode
26 signal line
28 signal generator
30 connecting line
32 switching means
33 evaluation circuit
34, 34' pressure sensor
35 individual electrodes (sensing electrode)
36 individual sensors (pressure)
40 anti-pinch sensor
41 electrodes (pressure sensor)
43 piezoceramic
45 anti-pinch sensor
48 evaluation circuit
50 AC voltage source
52 ohmic resistor
53 measuring capacitor
54 ohmic resistor
55 measuring capacitor
57 signal tap
58 signal tap
60 evaluation unit
61 capacitance evaluation means
63 sensor evaluation means
65 output means
66 detection output
68 control line

The invention claimed is:

1. An anti-pinch sensor for detecting an obstacle in the path of an actuating element of a motor vehicle, the anti-pinch sensor comprising:
a sensing electrode configured to generate an external electric field with respect to a counter electrode;
a pressure sensor decoupled from the sensing electrode and configured to detect a mechanical pressure; and a shielding electrode formed as a driven shield wherein the sensing electrode, the pressure sensor, or the shielding electrodes are arranged in a sensor body of the anti-pinch sensor.

2. The anti-pinch sensor according to claim 1, wherein the sensor body comprises a pressure sensor part, made of a flexible, particularly elastic material, and a sensing electrode part, made of a material with a greater hardness.

3. The anti-pinch sensor according to claim 1, wherein the pressure sensor is arranged as a contact element on a supporting surface of the sensor body.

4. The anti-pinch sensor according to claim 1, wherein the sensor body extends in a longitudinal direction and the sensing electrode is made as a flat conductor.

5. The anti-pinch sensor according to claim 4, wherein the sensor body is made as a sealing body with a sealing contour.

6. The anti-pinch sensor according to claim 4, wherein the sensing electrode is divided along the longitudinal direction into a number of individual electrodes, at least two of which are contacted via separate lines.

7. The anti-pinch sensor according to claim 4, wherein the pressure sensor is segmented along the longitudinal direction into a number of separate readable individual sensors.

8. The anti-pinch sensor according to claim 1, wherein an electrode of the pressure sensor is used as the shielding electrode of the driven shield.

9. The anti-pinch sensor according to claim 1, wherein the shielding electrode, formed as a driven shield, is arranged to direct the electric field into a hazard region.

10. The anti-pinch sensor according to claim 6 wherein the shielding electrode is divided into electrically contactable individual electrodes between which the separate lines are arranged in an insulated manner.

11. The anti-pinch sensor according to claim 1, wherein the pressure sensor is made as a piezoelectric pressure sensor.

12. The anti-pinch sensor according to claim 8, wherein the shielding electrode is connected to a potential of the sensing electrode by switching means.

13. The anti-pinch sensor according to claim 2, wherein the sensor body is made as a flexible conductor structure.

14. An evaluation circuit for an anti-pinch sensor according to claim 1, with measurement potential output means to output a measurement potential to a sensing electrode, with capacitance detection means to detect a measurement capacitance formed by a counter electrode and a sensing electrode, with capacitance evaluation means to evaluate a change in the detected measurement capacitance, with sensor evaluation means for the independent detection and evaluation of signals from a pressure sensor, and with output means to output a detection signal as a function of the change over time in the measurement capacitance and to output a detection signal as a function of the evaluated signal of the pressure sensor.

15. The evaluation circuit according to claim 14, wherein the capacitance evaluation means are formed for evaluating a temporal change in the measuring capacitors.

16. The evaluation circuit according to claim 14, wherein the measurement potential output means comprise an AC voltage source.

17. The evaluation circuit according to claim 16, wherein the capacitance detection means contain a bridge circuit for detecting the measurement capacitance via their AC resistance or via their phase effect.

18. The evaluation circuit according to claim 14, wherein the capacitance detection and evaluation means and/or the sensor evaluation means are formed for the selective evaluation of individual electrodes and/or individual sensors arranged in segments.

19. The evaluation circuit according to claim 18, wherein the output means are designed for outputting the detection signal to prioritize differently the signals of the individual electrodes and the individual sensors in the different segments.

20. The evaluation circuit according to claim 14, with selective filters for the signals of the measurement capacitance and/or the signals of the pressure sensor.

21. A component, comprising:
an anti-pinch sensor with a sensor body, the sensor body comprising a sensing electrode configured to generate an external electric field with respect to a counter electrode, and a pressure sensor decoupled from the sensing electrode and configured to detect a mechanical pressure; and
an evaluation circuit comprising:
a measurement potential output device configured to output a measurement potential to a sensing electrode;
a capacitance detection device configured to detect a measurement capacitance formed by a counter electrode and a sensing electrode;
a capacitance evaluation device configured to evaluate a change in the detected measurement capacitance;
a sensor evaluation device configured to independently detect and evaluate signals from a pressure sensor; and
an output component configured to output a detection signal as a function of a change over time in the measurement capacitance and configured to output a detection signal as a function of the evaluated signal of the pressure sensor.

22. Use of an anti-pinch sensor in a motor vehicle, the anti-pinch sensor having a sensor body comprising a sensing electrode configured to generate an external electric field with respect to a counter electrode, and a pressure sensor decoupled from the sensing electrode and configured to detect a mechanical pressure, wherein the grounded body of the motor vehicle is used as the counter electrode.

* * * * *